US012757726B2

(12) United States Patent
Shindo

(10) Patent No.: US 12,757,726 B2
(45) Date of Patent: Oct. 6, 2026

(54) SEMICONDUCTOR DEVICE AND SEMICONDUCTOR DEVICE FABRICATION METHOD

(71) Applicant: LAPIS SEMICONDUCTOR CO., LTD., Kanagawa (JP)

(72) Inventor: Masanori Shindo, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 864 days.

(21) Appl. No.: 17/956,018

(22) Filed: Sep. 29, 2022

(65) Prior Publication Data

US 2023/0094425 A1 Mar. 30, 2023

(30) Foreign Application Priority Data

Sep. 30, 2021 (JP) ................................ 2021-161310

(51) Int. Cl.

*H10W 20/40* (2026.01)
*H01F 27/24* (2006.01)
*H01F 27/28* (2006.01)
*H10D 1/20* (2025.01)
*H10W 72/20* (2026.01)

(52) U.S. Cl.

CPC .......... *H10W 20/497* (2026.01); *H01F 27/24* (2013.01); *H01F 27/2804* (2013.01); *H10D 1/20* (2025.01); *H10W 72/252* (2026.01)

(58) Field of Classification Search

CPC ................. H01L 23/5227; H01L 24/13; H01L 2224/13147; H01L 24/03; H01L 24/05; H01F 27/24; H01F 27/2804; H01F 2017/0066; H01F 17/0006; H10D 1/20

See application file for complete search history.

(56) References Cited

U.S. PATENT DOCUMENTS

2019/0131285 A1 5/2019 Kim et al.
2021/0273036 A1* 9/2021 Marin .................... H05K 1/181
2022/0293327 A1* 9/2022 Ganesan ............. H01L 23/5227

FOREIGN PATENT DOCUMENTS

JP 2007019333 A * 1/2007
JP 2019083304 A 5/2019

OTHER PUBLICATIONS

Japanese Office Action dated Mar. 4, 2025 in Japanese Patent Application No. 2021-161310.

(Continued)

*Primary Examiner* — Christine S. Kim
*Assistant Examiner* — Andrew Victor Prostor
(74) *Attorney, Agent, or Firm* — Volentine, Whitt & Francos, PLLC

(57) ABSTRACT

There is provided a semiconductor device including: a circuit region formed on a semiconductor substrate; a first insulating film covering at least a portion of a region on the semiconductor substrate that includes an upper portion of the circuit region; redistribution wiring disposed on the first insulating film; a coil formed by the redistribution wiring on the first insulating film, the coil being connected to the circuit region; a first soft magnetic material film disposed in an aperture portion of the first insulating film, the aperture portion being provided at a lower portion of the coil; and a second soft magnetic material film that is disposed on the first soft magnetic material film, the second soft magnetic material film covering at least a portion of the coil.

9 Claims, 11 Drawing Sheets

(56) References Cited

OTHER PUBLICATIONS

Noritaka Anzai et al., "Development of Inductor Built-in Technology in Wafer Level Chip Size Package (W-CSP)", Oki Technical Review, Japan, Oct. 2003, vol. 70, No. 4 (No. 196), p. 76-79, https://www.oki.com/jp/otr/2003/n196/pdf/196_R21.pdf.

* cited by examiner 25-1
12-4
12-3
25-1
13
11

25-1
24-1
25-1
13

22
16-4
16-3
17
24-1

25-2
25-1
17
25-2
25-1

25-2
25-1
17
24-2
25-2
25-1

25-2
17
25-1
10A
20
25-2
24-2
25-1
24-1

SEMICONDUCTOR DEVICE AND SEMICONDUCTOR DEVICE FABRICATION METHOD

CROSS-REFERENCE TO RELATED APPLICATION

This application is based on and claims priority under 35 USC 119 from Japanese Patent Application No. 2021-161310 filed on Sep. 30, 2021, the disclosure of which is incorporated by reference herein.

BACKGROUND

Technical Field

The present disclosure relates to a semiconductor device and to a fabrication method of the semiconductor device.

Related Art

A wafer-level chip-scale package (WL-CSP) is known as a type of packaging of semiconductor devices. A WL-CSP is one kind of ultra-compact integrated circuits referred to as chip-scale packages (CSP). A CSP is a package that is basically a type of ball grid array (BGA) packaging in which the size of the BGA is greatly reduced and the package is shrunk to about the same size as a mounted semiconductor integrated circuit. At the wafer-level stage in a process for fabricating a WL-CSP, a redistribution wiring layer is formed on a circuit surface pad, the surface is sealed with, for example, resin except at connections with the redistribution wiring, and the wafer is subsequently diced into individual chips. WL-CSP has advantages such as, when a semiconductor integrated circuit is mounted on a circuit board such as a printed circuit board or the like, a dedicated area may be greatly reduced.

For example, Japanese Patent Application Laid-Open (JP-A) No. 2019-083304 is known as a document disclosing a technology relating to a BGA. A fan-out semiconductor package module according to JP-A No. 2019-083304 includes: a core member with a first penetrating hole and a second penetrating hole that are spaced apart from one another; a semiconductor integrated circuit that is disposed in the first penetrating hole and has an active surface at which a connection pad is disposed and an inactive surface at the opposite side from the active surface; a second passive component disposed in the second penetrating hole; a first sealing member that covers at least portions of each of the core member and the second passive component and fills at least a portion of the interior of the second penetrating hole; a reinforcing member disposed on the first sealing member; a second sealing member that covers at least a portion of the semiconductor integrated circuit and fills at least a portion of the interior of the first penetrating hole; and a coupling member that is disposed on the core member, the active surface of the semiconductor integrated circuit and the second passive component, the coupling member including a redistribution layer that is electronically coupled with the connection pad and the second passive component.

An inductor can be mentioned as a passive component that is necessary for a circuit constituting a semiconductor device. An inductor may be formed of a wiring member or the like in a spiral pattern (a coil) at a circuit surface of the semiconductor device. With regard to available space in this case, there may be limits on, for example, making a wiring length longer and increasing a number of coil turns. Therefore, an inductance value that can be provided is limited. Thus, when an inductance value greater than a certain level is required, an inductor is formed as a discrete component mounted separately from the semiconductor device. In a fan-out semiconductor package module according to JP-A No. 2019-083304, an inductor that is a passive component is formed as a discrete component and disposed in the penetrating hole.

FIG. 11A shows a sectional diagram of a semiconductor device 150 according to a comparative example, inside which an inductor region 100 relating to the comparative example is formed. The meaning of the term "inductor region" as used here is intended to include a region of the semiconductor device 150 with a structure that exhibits the operation of an inductor. The semiconductor device 150 is fabricated using WL-CSP technology. As is shown in FIG. 11A, the semiconductor device 150 includes pads 12-1 and 12-2 formed on a semiconductor substrate 11, a passivation film 13, vias 16-1 and 16-2, insulating films 14 and 15, redistribution wiring 17, a post 18, a solder terminal 19, and a mold 20.

FIG. 11B shows a sectional diagram of the inductor region 100. As shown in FIG. 11B, the inductor region 100 includes the semiconductor substrate 11, pads 12-3 and 12-4, the passivation film 13, vias 16-3 and 16-4, an insulating film 25, the redistribution wiring 17 and the mold 20. The insulating film 25 is depicted as a single film combining the insulating films 14 and 15 of FIG. 11A. A coil 22 in which the redistribution wiring 17 is arranged in a spiral shape is formed at an upper portion of the insulating film 25. The vias 16-3 and 16-4 are connected to, respectively, one end and another end of the coil 22 and are connected, via the pads 12-3 and 12-4, to a circuit region formed in a semiconductor integrated circuit (not shown in the drawings). The meaning of the term "semiconductor integrated circuit" as used here is intended to include semiconductor components of the semiconductor device 150 in a state prior to redistribution wiring.

In a WL-CSP, it is excellent if an inductor can be mounted in a semiconductor device. Heretofore, however, only inductors with limited inductance values have been mounted in semiconductor devices for limited fields of use such as communications and the like. That is, there have been limits on inductance values of the inductor region 100 of the semiconductor device 150. There have been calls for inductors for high-voltage applications such as power supply circuits and the like (below referred to as "power inductors") that could assure, in particular, small wiring resistance and desired inductance values. Accordingly, conventionally, power inductors have been disposed outside semiconductor devices as discrete components. As a result, there have been limits on reductions in dedicated area of semiconductor devices and related components. To mount a power inductor in a WL-CSP, for example, as in the semiconductor device 150, an improvement in performance (inductance, wiring resistance and the like) relative to an inductor with the same shape and dedicated area is called for.

SUMMARY

In consideration of the circumstances described above, an object of the present disclosure is to provide a semiconductor device including an inductor with improved performance, and a fabrication method of the semiconductor device.

In order to solve the problem described above, a semiconductor device according to the present disclosure includes: a circuit region formed on a semiconductor substrate; a first insulating film covering at least a portion of a region on the semiconductor substrate that includes an upper portion of the circuit region; redistribution wiring disposed on the first insulating film; a coil formed by the redistribution wiring on the first insulating film, the coil being connected to the circuit region; a first soft magnetic material film disposed in an aperture portion of the first insulating film, the aperture portion being provided at a lower portion of the coil; and a second soft magnetic material film that is disposed on the first soft magnetic material film, the second soft magnetic material film covering at least a portion of the coil.

In order to solve the problem described above, another aspect of the semiconductor device according to the present disclosure includes: a circuit region formed on a semiconductor substrate; an insulating film covering at least a portion of a region on the semiconductor substrate that includes an upper portion of the circuit region; redistribution wiring disposed on the insulating film; a coil formed by the redistribution wiring on the insulating film, the coil being connected to the circuit region; and a soft magnetic material film disposed on the insulating film, the soft magnetic material film covering at least a portion of the coil.

In order to solve the problem described above, a semiconductor device fabrication method according to the present disclosure includes: forming a circuit region on a semiconductor substrate; forming a first insulating film in a region that includes an upper portion of the circuit region and excludes a first predetermined region; forming a first soft magnetic material film inside the first predetermined region; forming a coil at an upper portion of the first soft magnetic material film, the coil being connected to the circuit region; forming a second insulating film in a region of an upper portion of the first insulating film, the region excluding a second predetermined region that overlaps with at least a portion of the first predetermined region in a plan view; and forming a second soft magnetic material film inside the second predetermined region.

In order to solve the problem described above, another aspect of the semiconductor device fabrication method according to the present disclosure includes: forming a circuit region on a semiconductor substrate; forming an insulating film that covers at least a portion of a region on the semiconductor substrate, the region including an upper portion of the circuit region; forming a first soft magnetic material film on the insulating film; forming a coil at an upper portion of the first soft magnetic material film, the coil being connected to the circuit region; and forming a second soft magnetic material film on the first soft magnetic material film, the second soft magnetic material film covering at least a portion of the coil.

According to the present disclosure, an effect is provided in that a semiconductor device including an inductor with improved performance, and a fabrication method of the semiconductor device, may be provided.

BRIEF DESCRIPTION OF THE DRAWINGS

Exemplary embodiments of the present disclosure will be described in detail based on the following figures, wherein.

DETAILED DESCRIPTION

Below, exemplary embodiments of the present disclosure are described in detail with reference to the drawings. In the exemplary embodiments described below, modes are illustrated and described in which the semiconductor device according to the present disclosure is applied to a semiconductor device including an inductor region. In the exemplary embodiments described below, for convenience, descriptions are divided between the inductor region and the semiconductor device that includes the inductor region, but semiconductor devices according to the present exemplary embodiments may be modes with an inductor alone and may be modes including a peripheral circuit. In the exemplary embodiments described below, modes are illustrated and described in which the inductor of the inductor region is applied to, in particular, a power inductor for high-voltage applications.

First Exemplary Embodiment

A semiconductor device 50 including an inductor region 10 according to the present exemplary embodiment is described with reference to FIG. 1A to FIG. 6.

Figure 1A:
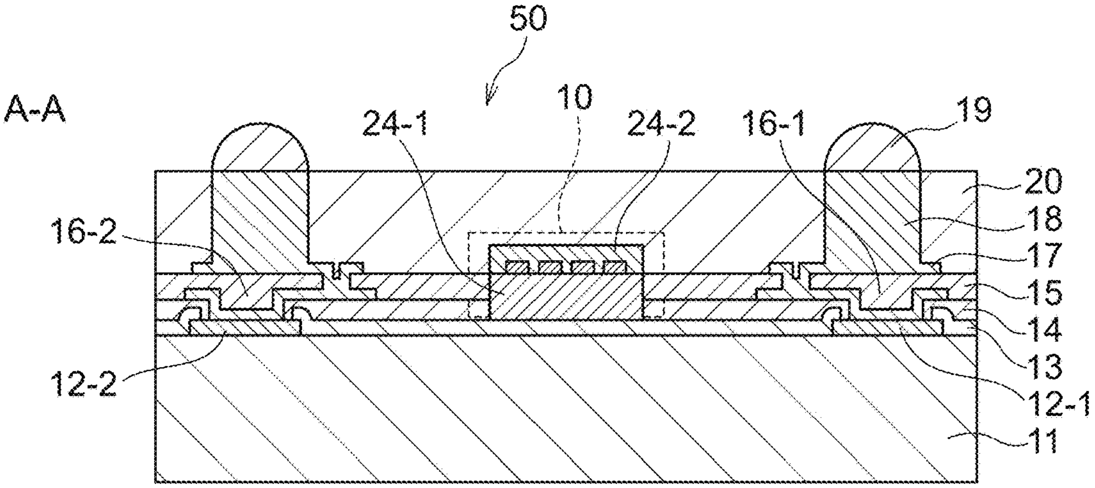
FIG. 1A is a sectional diagram of a semiconductor device according to a first exemplary embodiment.
Figure 1B:
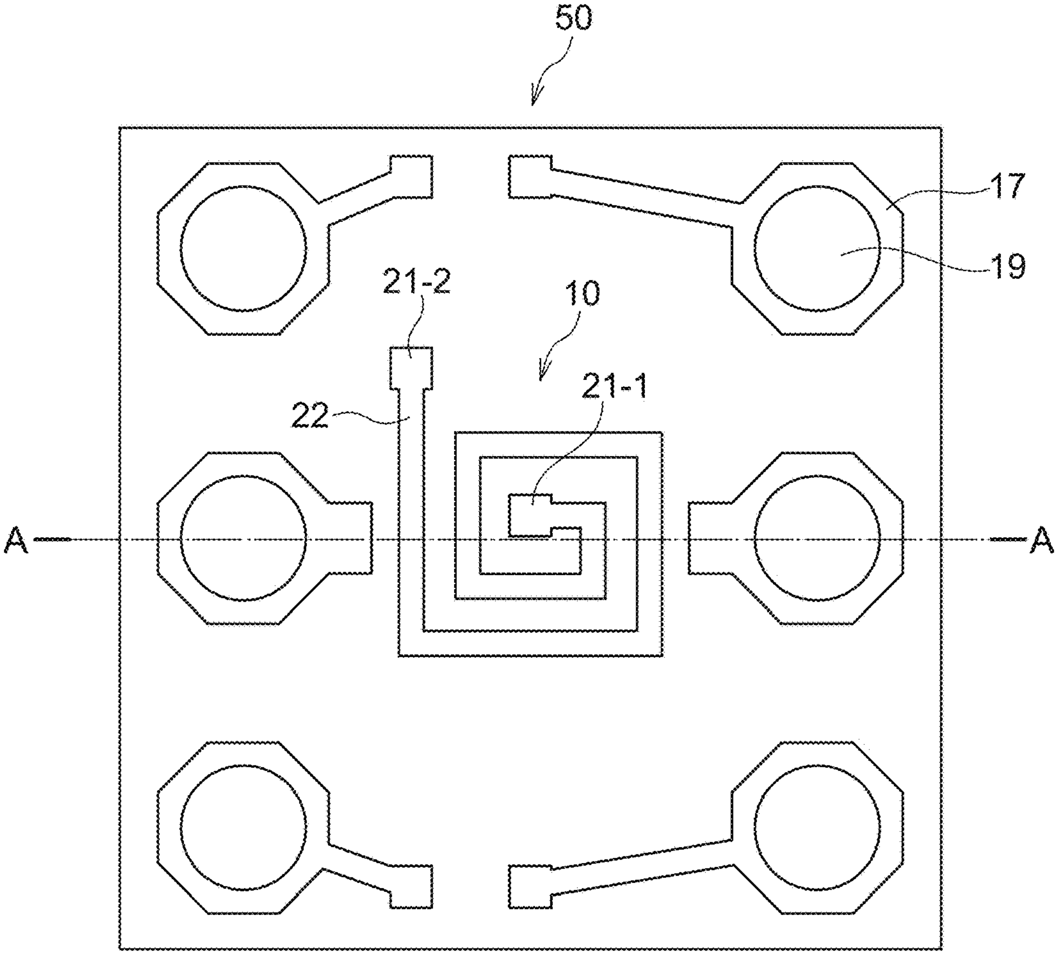
FIG. 1B is a plan view of the semiconductor device according to the first exemplary embodiment.

FIG. 1A is a sectional diagram of the semiconductor device 50 according to the present exemplary embodiment and FIG. 1B is a plan view of the semiconductor device 50. FIG. 1A is a sectional diagram cut along line A-A in FIG. 1B. The inductor region 10 is formed in the semiconductor device 50. The meaning of the term “inductor region” as used herein is intended to include a region of the semiconductor device 50 with a structure that exhibits the operation of an inductor. In the present exemplary embodiment, the meaning of the term is intended to include, in addition to the coil 22 formed of wiring (the redistribution wiring 17, described below), which is described below, structures that regulate the operation as an inductor, such as a first soft magnetic material film 24-1, a second soft magnetic material film 24-2 and so forth. In the semiconductor device 50 according to the present exemplary embodiment, the inductor region 10 is formed at an upper portion of a semiconductor substrate at which no circuit is formed. However, the inductor region 10 may be formed at an upper portion of a circuit region in which a circuit is formed.

Figure 11A:
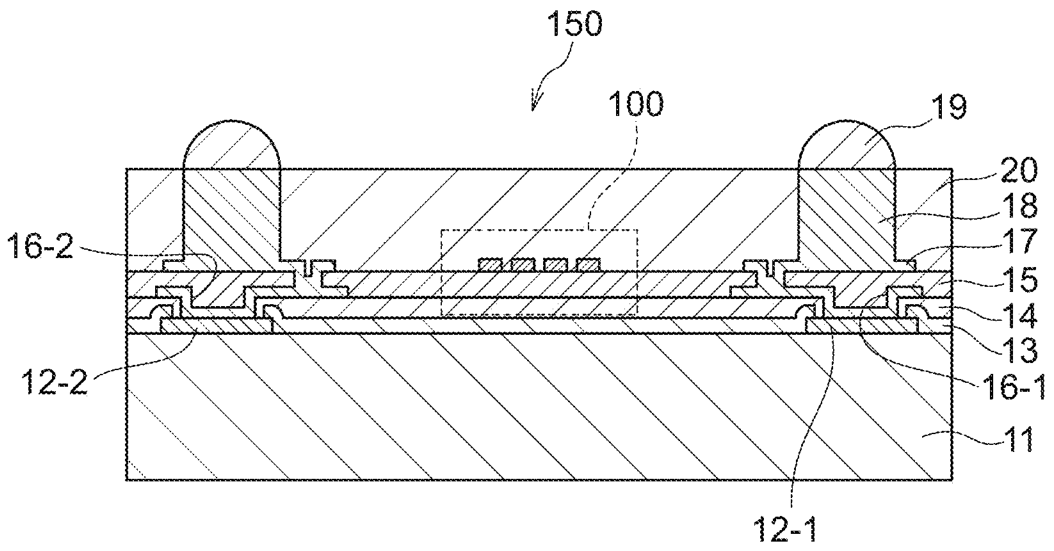
FIG. 11A is a sectional diagram of a semiconductor device according to a comparative example.
Figure 11B:
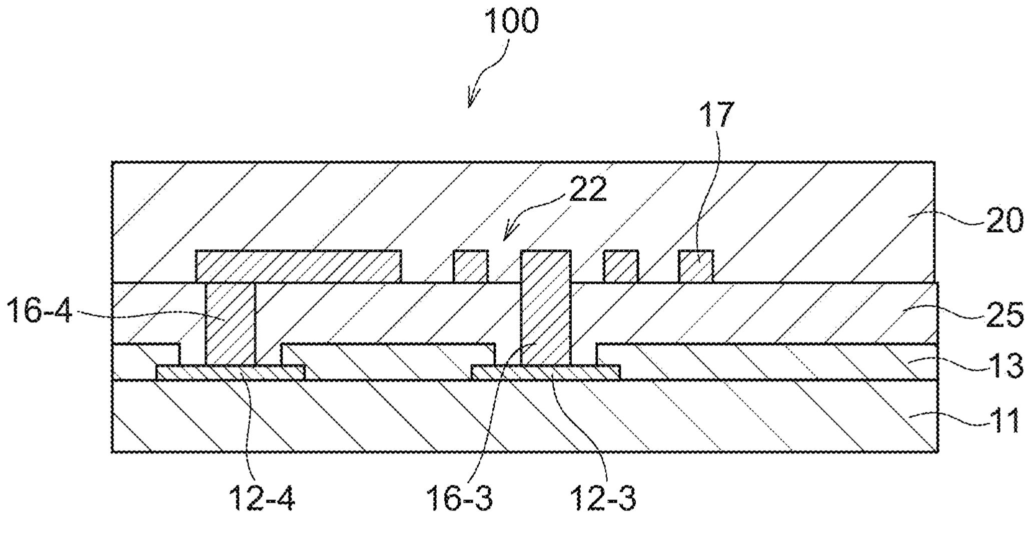
FIG. 11B is a sectional diagram of an inductor region according to the variant example.

The semiconductor device 50 shown in FIG. 1A is fabricated using WL-CSP technology, similarly to the semiconductor device 150 shown in FIG. 11A, and has a basically similar structure to the semiconductor device 150. That is, as shown in FIG. 1A, the semiconductor device 50 includes the semiconductor substrate 11, the pads 12-1 and 12-2 (where collectively referred to below, "the pads 12", including the pads 12-3 and 12-4 which are described below), the passivation film 13, the insulating films 14 and 15, the vias 16-1 and 16-2 (where collectively referred to below, "the vias 16", including the vias 16-3 and 16-4 which are described below), the redistribution wiring 17, the post 18, the solder terminal 19 and the mold 20. The pads 12 are formed of, for example, aluminium (Al), and are exposed through aperture portions provided in the passivation film 13. The passivation film 13 is formed as, for example, a silicon nitride film and covers portions of the semiconductor substrate 11 and the pads 12. The insulating films 14 and 15 are formed as, for example, polyimide films. The insulating film 14 covers portions of the passivation film 13 and the pads 12. The insulating film 15 covers portions of the insulating film 14 and the vias 16-1 and 16-2. A layer including the redistribution wiring 17, the insulating films 14 and 15 and the post 18 is a "redistribution layer" according to the present exemplary embodiment.

In the semiconductor device 50 shown in FIG. 1A, the inductor region 10 is formed in the region encircled by a dotted line. A material of the semiconductor substrate 11 is not restricted but, as an example in the present exemplary embodiment, a silicon (Si) substrate is employed. The first soft magnetic material film 24-1 and second soft magnetic material film 24-2 shown in FIG. 1A are described in more detail below.

As shown in FIG. 1B, the coil 22 is formed in the inductor region 10. Respective terminals 21-1 and 21-2 are disposed at the one end and the another end of the coil 22. The meaning of the term "the coil 22" as used in the present exemplary embodiment is intended to include a wiring region of the redistribution wiring 17 that is formed in a spiral shape. That is, the coil 22 according to the present exemplary embodiment is formed in the redistribution layer.

The semiconductor substrate 11, pads 12-1 and 12-2 and passivation film 13 shown in FIG. 1A are portions that are fabricated by a semiconductor integrated circuit fabrication process. The insulating films 14 and 15, vias 16-1 and 16-2, redistribution wiring 17, post 18, solder terminal 19 and mold 20 are portions that are fabricated by a redistribution wiring process. In the present exemplary embodiment, the redistribution layer, in which the coil 22 is formed on the insulating film 15, and the vias 16-1 and 16-2 (and the vias 16-3 and 16-4 described below) are referred to as the redistribution wiring 17.

The vias 16-1 and 16-2 are provided in the insulating film 14. One ends of the vias 16-1 and 16-2 are connected to, respectively, the pads 12-1 and 12-2. The other ends of the vias 16-1 and 16-2 are connected to the redistribution wiring 17 on the insulating film 15. In the semiconductor device 50, wiring may be extended to the location of the post 18 by the redistribution wiring 17 on the insulating film 14.

The post 18 and solder terminal 19 are a terminal for when, for example, the semiconductor device 50 is mounted on a printed circuit board or the like (not shown in the drawings). The post 18 is formed of, for example, copper (Cu). The mold 20 is a sealing resin that protects circuits and the like formed on the semiconductor substrate 11 from the outside air and the like.

Figure 2A:
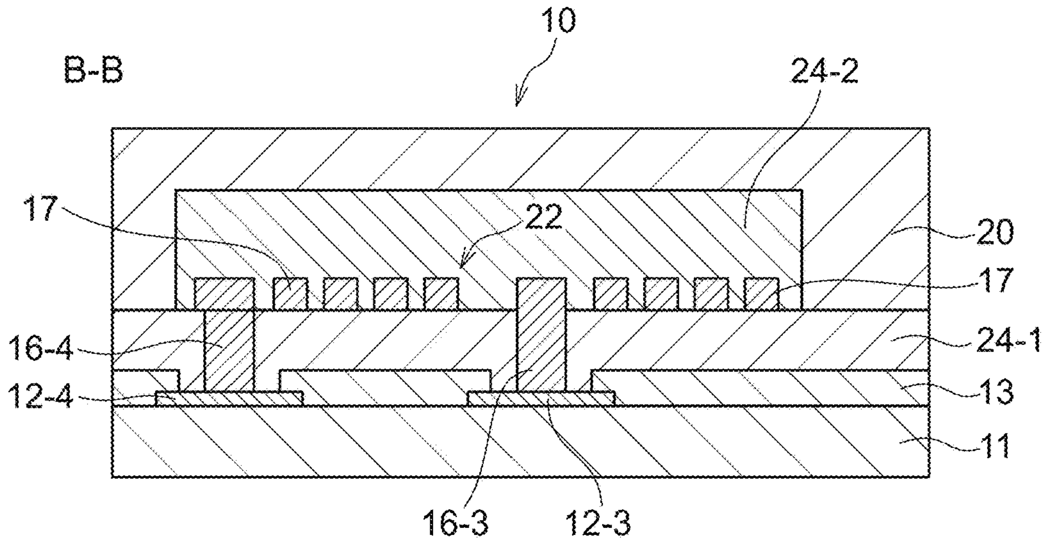
FIG. 2A is a sectional diagram of an inductor region according to the first exemplary embodiment.
Figure 2B:
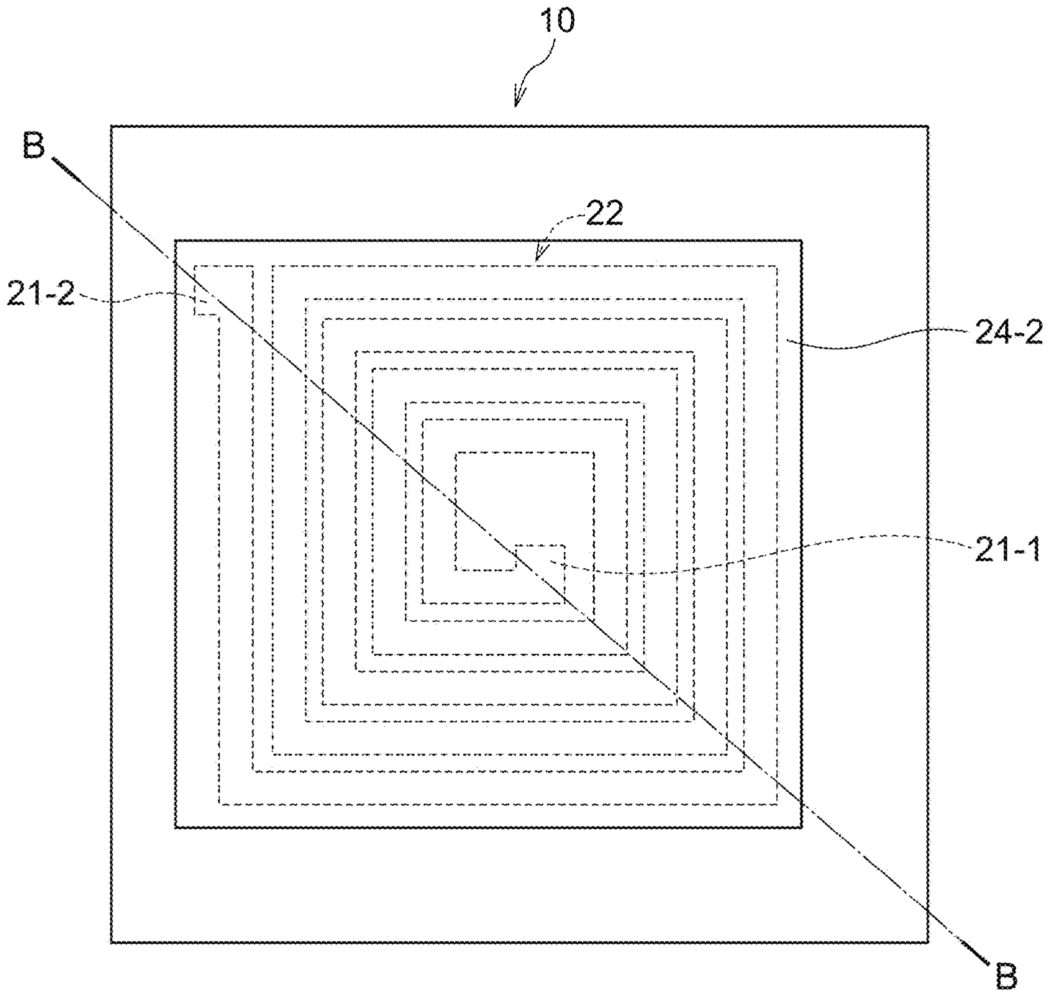
FIG. 2B is a plan view of the inductor region according to the first exemplary embodiment.

FIG. 2A is a sectional diagram and FIG. 2B is a plan view of the inductor region 10 according to the present exemplary embodiment. FIG. 2A depicts a section cut along line B-B shown in FIG. 2B. The inductor region 10 shown in FIG. 2A includes the semiconductor substrate 11, the pads 12-3 and 12-4, the passivation film 13, the vias 16-3 and 16-4, the redistribution wiring 17, the first soft magnetic material film 24-1 and second soft magnetic material film 24-2 (where collectively referred to below, "the soft magnetic material films 24"), and the mold 20.

As shown in FIG. 2A and FIG. 2B, the coil 22 is formed in the redistribution wiring 17. The coil 22 according to the present exemplary embodiment is formed by wiring being arranged in a spiral with a substantially rectangular shape. However, the shape of the coil 22 is not limited thus; the coil 22 may be formed by wiring being arranged in a spiral with a circular shape or an elliptical shape. The vias 16-3 and 16-4 are connected to, respectively, the terminal 21-1 that is one end of the coil 22 and the terminal 21-2 that is the another end of the coil 22. The vias 16-3 and 16-4 are connected to a circuit formed in the semiconductor integrated circuit via, respectively, the pads 12-3 and 12-4.

In contrast to the inductor region 100 according to the comparative example, the inductor region 10 according to the present exemplary embodiment is arranged so as to improve performance such as inductance, wiring resistance and the like, so as to enable use as, for example, a power conductor. That is, as shown in FIG. 2A, the inductor region 10 according to the present exemplary embodiment is provided with the first soft magnetic material film 24-1 and second soft magnetic material film 24-2, which are not present in the inductor region 100. The first soft magnetic material film 24-1 is formed on the passivation film 13, and the second soft magnetic material film 24-2 is formed to cover the redistribution wiring 17 in which the coil 22 and the like are formed on the first soft magnetic material film 24-1. Materials of the soft magnetic material films 24 are not particularly limited but, as an example in the present exemplary embodiment, insulator films of resin or the like containing a magnetic powder of a soft magnetic material are employed.

The first soft magnetic material film 24-1 and second soft magnetic material film 24-2 are not divided from one another but are wholly integrated in the present exemplary embodiment. However, if there is no impediment with regard to the inductance value of the inductor region 10 or the like, the first soft magnetic material film 24-1 and second soft magnetic material film 24-2 may be divided. Further, modes are possible in which only one of the first soft magnetic material film 24-1 and second soft magnetic material film 24-2 is arranged.

According to the inductor region 10 according to the present exemplary embodiment, leakage magnetic flux is suppressed by operation of the soft magnetic material films 24, a value of inductance L is greater than that of an inductance region of the same size at which the soft magnetic material films 24 are not provided, and because a wiring length may be shorter due to the increase in the inductance L, wiring resistance is smaller. That is, according to the inductor region 10, performance may be improved. Magnetic flux generated in the coil 22 is confined inside the first soft magnetic material film 24-1 and the second soft magnetic material film 24-2, and leakage to the exterior is suppressed. Therefore, effects of magnetic flux from the coil 22 on other circuits formed on the semiconductor substrate 11 and the like are suppressed. Thus, although there is concern about the generation of noise and the like at other circuits due to magnetic flux of the coil 22 in the inductor region 100 according to the comparative example in which no soft magnetic material film is provided, the inductor region 10 according to the present exemplary embodiment may suppress the generation of noise and the like at other circuits.

Figure 3:
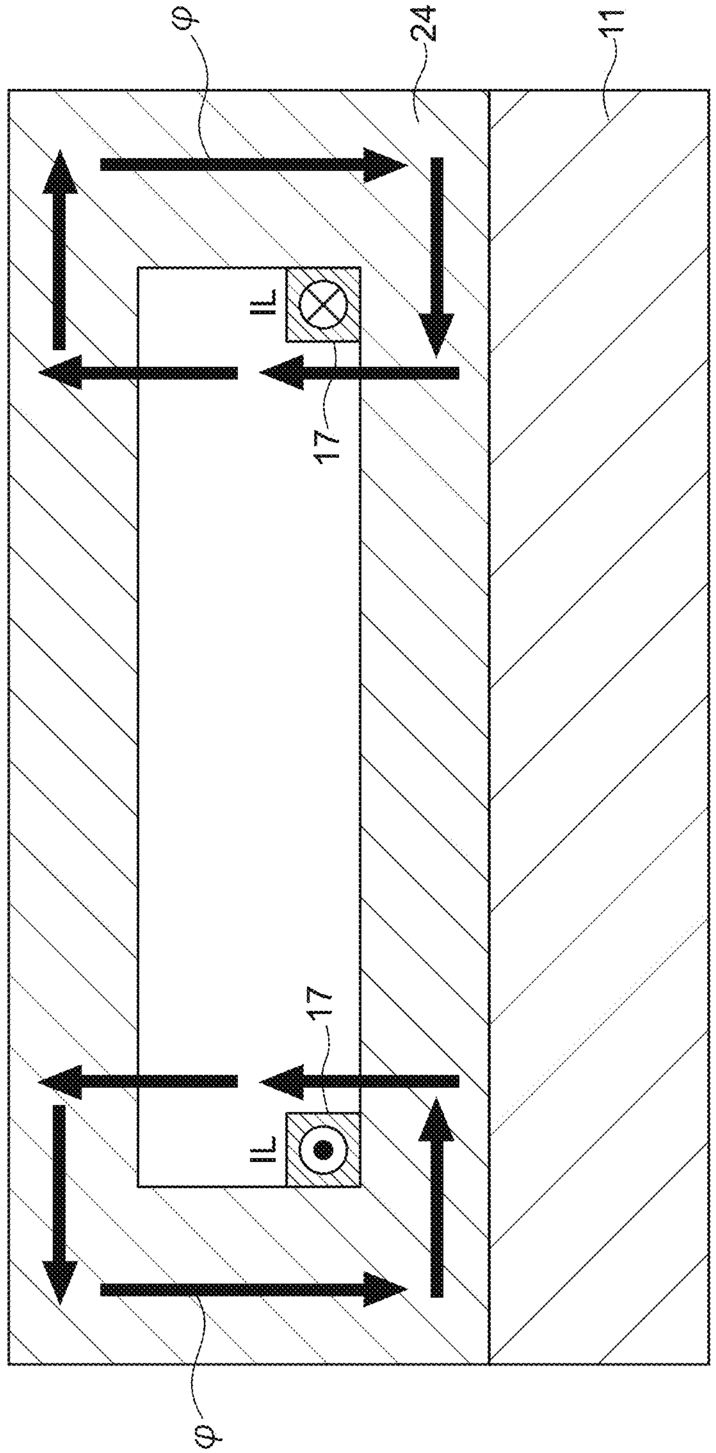
FIG. 3 is a schematic view describing operation of the inductor region according to the exemplary embodiment.

The suppression of leakage of magnetic flux is described in more detail with reference to FIG. 3. FIG. 3 is a diagram schematically showing relationships between the soft magnetic material films 24 and coil 22 shown in FIG. 2A. That is, the redistribution wiring 17 that structures portions of the coil 22 is formed on the soft magnetic material films 24, and the redistribution wiring 17 is enclosed by the soft magnetic material films 24. A current IL flows in the redistribution wiring 17 in the directions shown in FIG. 3. The current IL shown at the left side of FIG. 3 flows in the direction from the far side of the drawing toward the near side, and the current IL shown at the right side of FIG. 3 flows in the direction from the near side of the drawing toward the far side.

In the structure shown in FIG. 3, magnetic flux Φ is generated in the rotation directions shown in the drawing at the left and right of the redistribution wiring 17. At the left side of the redistribution wiring 17, the magnetic flux Φ is generated in the counterclockwise direction, and at the right side of the redistribution wiring 17, the magnetic flux Φ is generated in the clockwise direction. Almost all of the generated magnetic flux Φ is confined in the soft magnetic material films 24, and leakage of the magnetic flux Φ to the exterior is suppressed. Due to this closed magnetic path structure, the inductance value is larger than that of an inductor region of the same size at which no soft magnetic material film 24 is provided, and performance of the inductor region 10 is improved. Because the coil 22 is formed directly on the semiconductor substrate 11 in the present exemplary embodiment, wiring lengths are short and wiring resistance is reduced. As a result, performance of the inductor region 10 is improved. Even when, for example, a circuit is formed at a principal surface of the semiconductor substrate 11 (not shown in the drawings) at a lower portion relative to the coil 22, the magnetic flux Φ is confined to the interior of the soft magnetic material films 24 and effects on this circuit are suppressed. Consequently, the generation of unintended electromotive forces, noise and the like is suppressed.

Figure 4A:
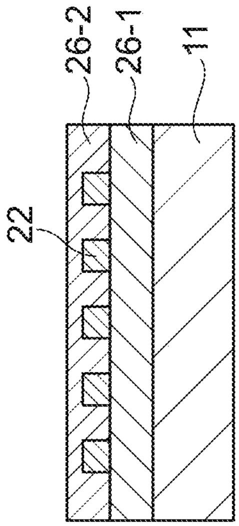
FIG. 4A to FIG. 4C are diagrams showing simulation models of the inductor region according to the exemplary embodiment.
Figure 4B:
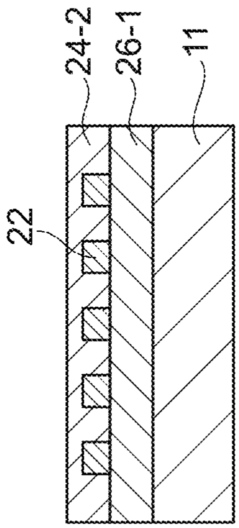
Figure 4C:
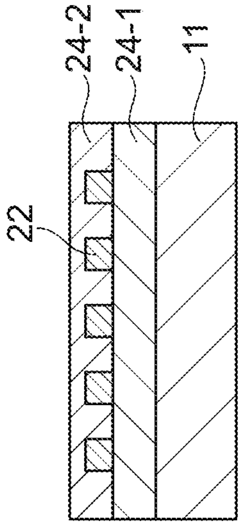
Figure 5C:
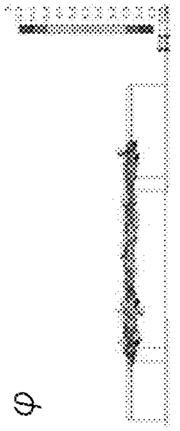
FIG. 5A to FIG. 5C are diagrams showing simulation results of the inductor region according to the exemplary embodiment.
Figure 5B:
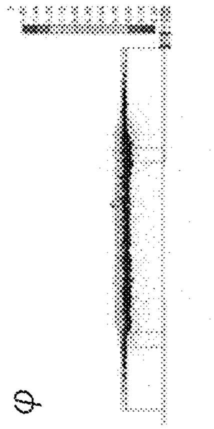
Figure 5A:
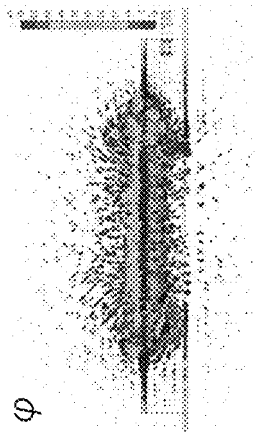

Now, operation of the first soft magnetic material film 24-1 and second soft magnetic material film 24-2 according to the present exemplary embodiment is described more specifically. FIG. 4A to FIG. 4C and FIG. 5A to FIG. 5C show results verifying the effect described above from simulations with an electromagnetic field simulator. FIG. 4A to FIG. 4C depict models used in the present simulations. FIG. 4A shows a structure in which the soft magnetic material films 24 are not arranged, FIG. 4B shows a structure in which only the second soft magnetic material film 24-2 at the upper portion of the coil 22 is arranged, and FIG. 4C shows a structure in which the first soft magnetic material film 24-1 and second soft magnetic material film 24-2 are arranged above and below the coil 22. FIG. 5A to FIG. 5C show results of simulation of distributions of magnetic flux Φ. FIG. 5A, FIG. 5B and FIG. 5C show results corresponding to, respectively, FIG. 4A, FIG. 4B and FIG. 4C. Conditions of the present simulations are as given below.

Film thickness of insulating film 26-1 (a polyimide film) =3 μm

Film thickness of insulating film 26-2=10 μm

Film thickness of soft magnetic material film 24-1=3 μm

Film thickness of soft magnetic material film 24-2=10 μm

Figure 6:
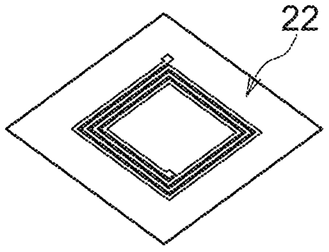
FIG. 6 is a diagram showing a simulation model of a coil according to the exemplary embodiment.

FIG. 6 shows a profile of the coil 22 used in the simulations. As shown in FIG. 6, the profile of the coil 22 in the present simulations is a substantially rectangular shape. Simulation conditions of the coil 22 are as given below.

Wiring material: copper (Cu)

Wire width=8 μm, wire spacing=8 μm

Wire thickness=7 μm

Length of one side of the coil 22=0.6 mm

As can be seen by comparing FIG. 5A, FIG. 5B and FIG. 5C, it is found that divergence of the magnetic flux Φ is greatly suppressed by arrangement of the second soft magnetic material film 24-2 or of the soft magnetic material films 24-1 and 24-2. It is apparent that there is no great difference in divergence of the magnetic flux Φ between the structure shown in FIG. 4B in which only the second soft magnetic material film 24-2 at the upper portion of the coil 22 is arranged and the structure shown in FIG. 4C in which the soft magnetic material films 24-1 and 24-2 are arranged above and below the coil 22. However, there is actually a large difference in magnetic flux vectors, and the impedance value is much larger in the structure shown in FIG. 4C in which both the soft magnetic material films 24-1 and 24-2 are arranged. Although not shown in FIG. 4A to FIG. 4C, a structure in which only the first soft magnetic material film 24-1 at the lower portion of the coil 22 is arranged is simulated, and it is found that the results are worse than the results of FIG. 4B but that there is a clear effect compared to FIG. 4A.

Second Exemplary Embodiment

A semiconductor device 50A and an inductor region 10A according to the present exemplary embodiment are described with reference to FIG. 7A to FIG. 10B. The present exemplary embodiment is a mode in which an insulating film is arranged around the inductor region. Principal structures of the inductor region and semiconductor device are shared with the first exemplary embodiment described above. Accordingly, structures that are the same are assigned the same reference symbols and duplicative descriptions are not given.

Figure 7A:
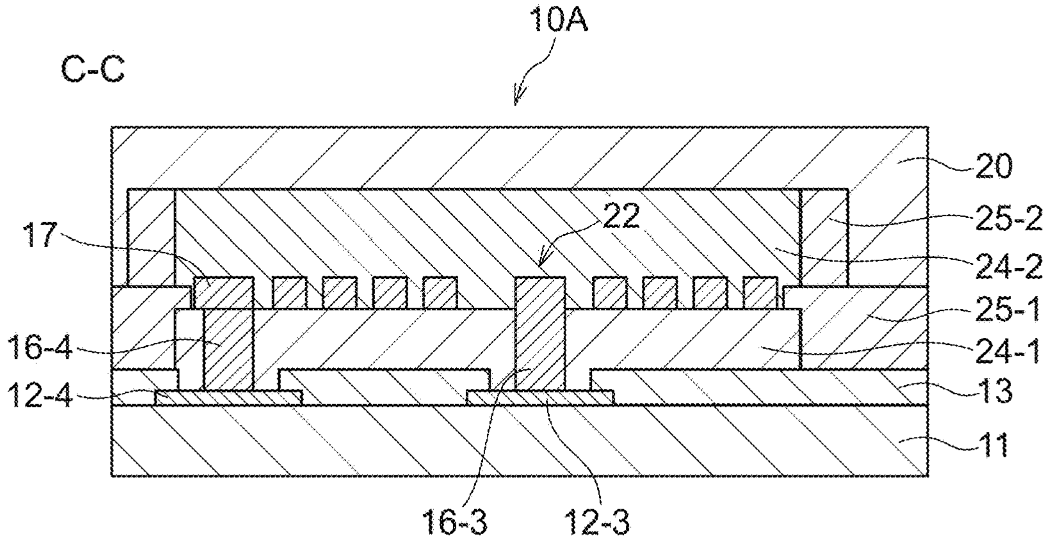
FIG. 7A is a sectional diagram of an inductor region according to a second exemplary embodiment.
Figure 7B:
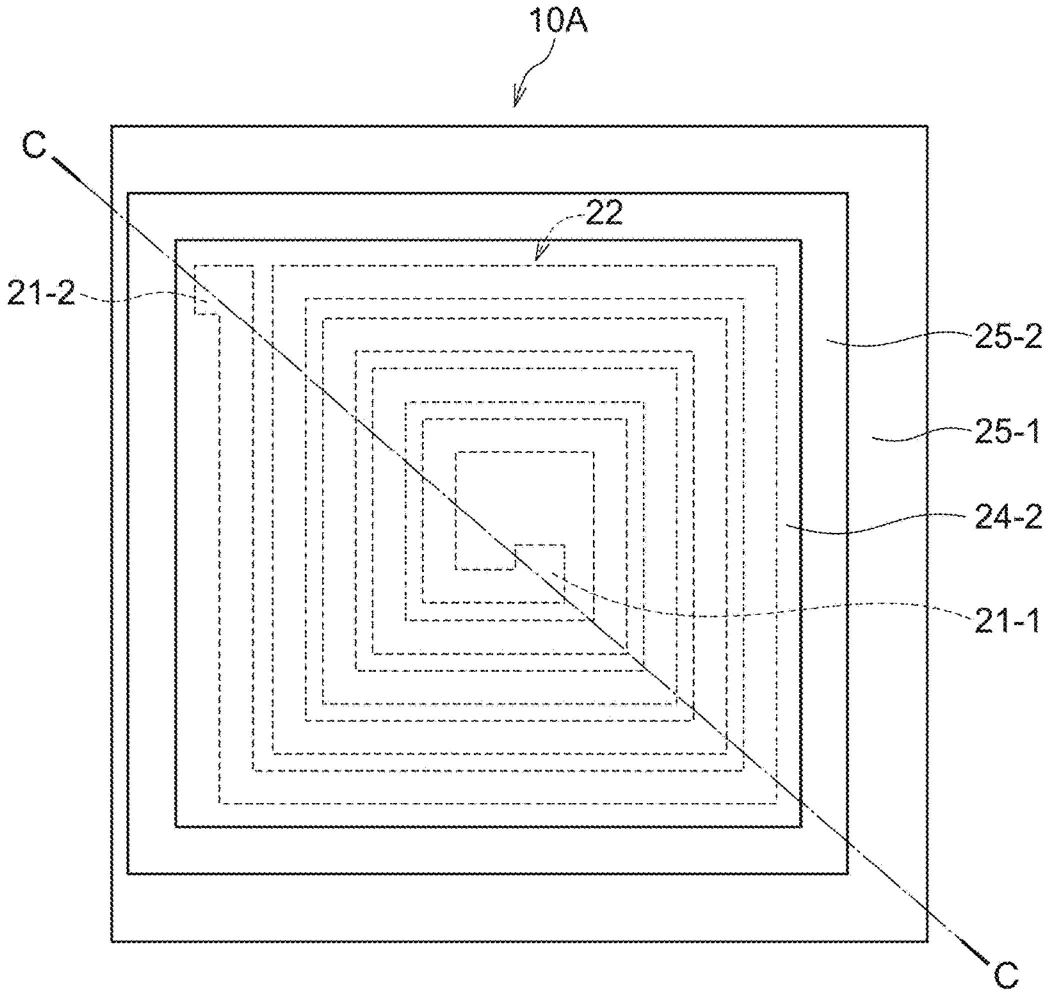
FIG. 7B is a plan view of the inductor region according to the second exemplary embodiment.

FIG. 7A is a sectional diagram of the inductor region 10A and FIG. 7B is a plan view of the inductor region 10A. FIG. 7A is a sectional diagram cut along line C-C in FIG. 7B.

As shown in FIG. 7A and FIG. 7B, the inductor region 10A includes a first support insulating film 25-1 and a second support insulating film 25-2 (where collectively referred to below, "the support insulating films 25"), which are not present in the inductor region 10 (see FIG. 2A and FIG. 2B). The first support insulating film 25-1 demarcates the shape of the first soft magnetic material film 24-1, and the second support insulating film 25-2 demarcates the shape of the second soft magnetic material film 24-2. The first support insulating film 25-1 is depicted as a single layer combining the insulating films 14 and 15 shown in FIG. 1A. In other words, the support insulating film 25-1 is formed by a common film of the insulating films 14 and 15. Because the inductor region 10A according to the present exemplary embodiment is provided with the support insulating films 25, shapes of the soft magnetic material films 24 are easier to control, and shapes of magnetic flux generated by the coil 22 are inevitably easier to control. Materials of the support insulating films 25 are not particularly limited but, as an example in the present exemplary embodiment, a photosensitive polyimide resin is employed. The first support insulating film 25-1 and second support insulating film 25-2 are examples of, respectively, a first insulating layer and second insulating layer according to the present disclosure.

Figure 8:
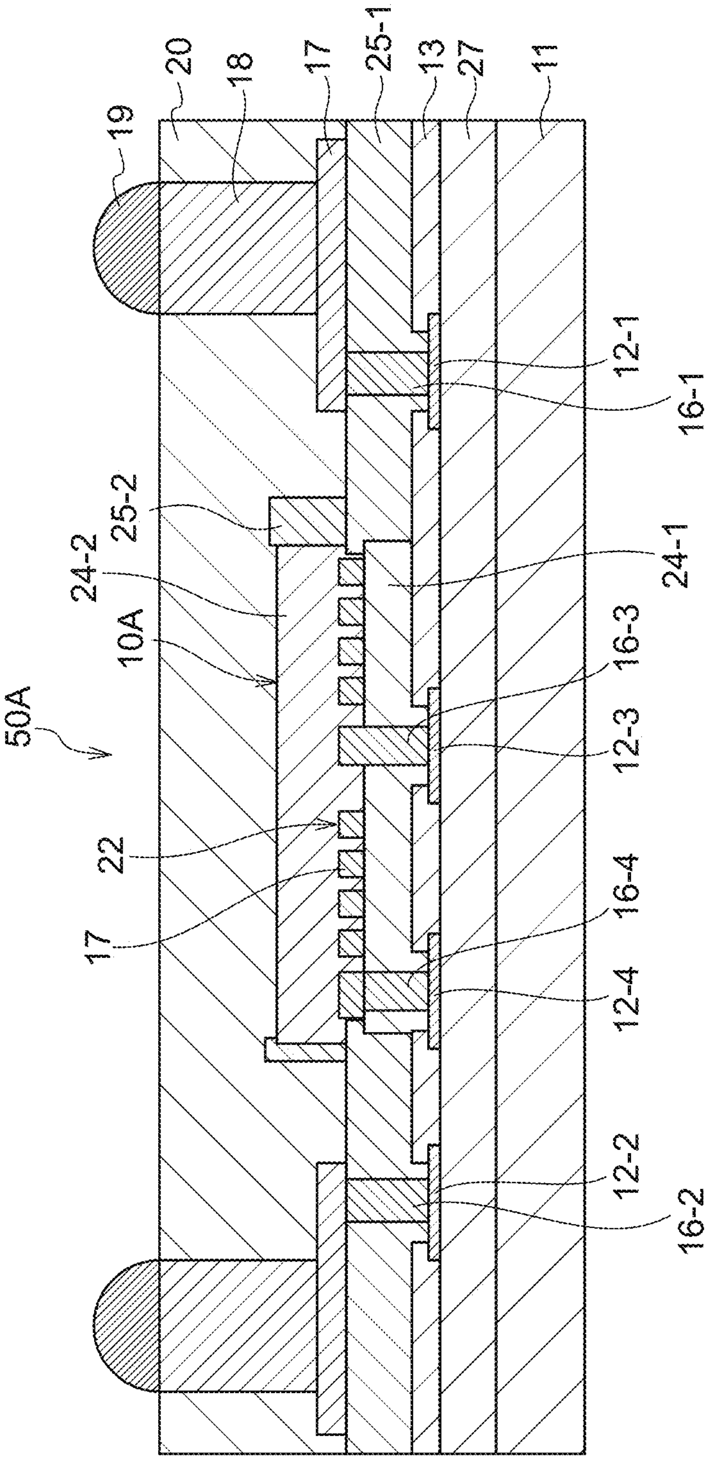
FIG. 8 is a sectional diagram of a semiconductor device according to the second exemplary embodiment.

FIG. 8 shows a sectional diagram of the semiconductor device 50A according to the present exemplary embodiment. In the semiconductor device 50A, the inductor region 10A is formed at an upper portion relative to a circuit region 27 in which a circuit is formed on the semiconductor substrate 11. Of course, the inductor region 10A may be formed in the semiconductor device 50A at an upper portion relative to the semiconductor substrate 11 at which the circuit region 27 is not formed. As shown in FIG. 8, the first support insulating film 25-1 extends along the circuit region 27, and the post 18 is formed at an upper portion of the first support insulating film 25-1. The second support insulating film 25-2 is formed at an upper portion of the first support insulating film 25-1. The coil 22 of the inductor region 10A is connected to a related circuit formed in the circuit region 27 via the pads 12-3 and 12-4.

Now, a fabrication method of the semiconductor device 50A including the inductor region 10A according to the present exemplary embodiment is described with reference to FIG. 9A to FIG. 9F, FIG. 10A and FIG. 10B. The fabrication method according to the present exemplary embodiment fabricates semiconductor devices in the form of a semiconductor wafer. However, the following descriptions focus on one each of the inductor region 10A and the semiconductor device 50A in a wafer.

A semiconductor wafer is prepared in which the circuit region 27 (not shown in FIG. 9A to FIG. 9F), the pads 12 and the passivation film 13, that is, a semiconductor integrated circuit, are formed on a principal surface (not shown in the drawings) of the semiconductor substrate 11. Then, using photolithography and etching, the first support insulating film 25-1 is formed (FIG. 9A) so as to encircle a region on the passivation film 13 in which the inductor region 10A is to be formed (see FIG. 7B).

Figures 9A, 9B, 9C, 9D, 9E, 9F:
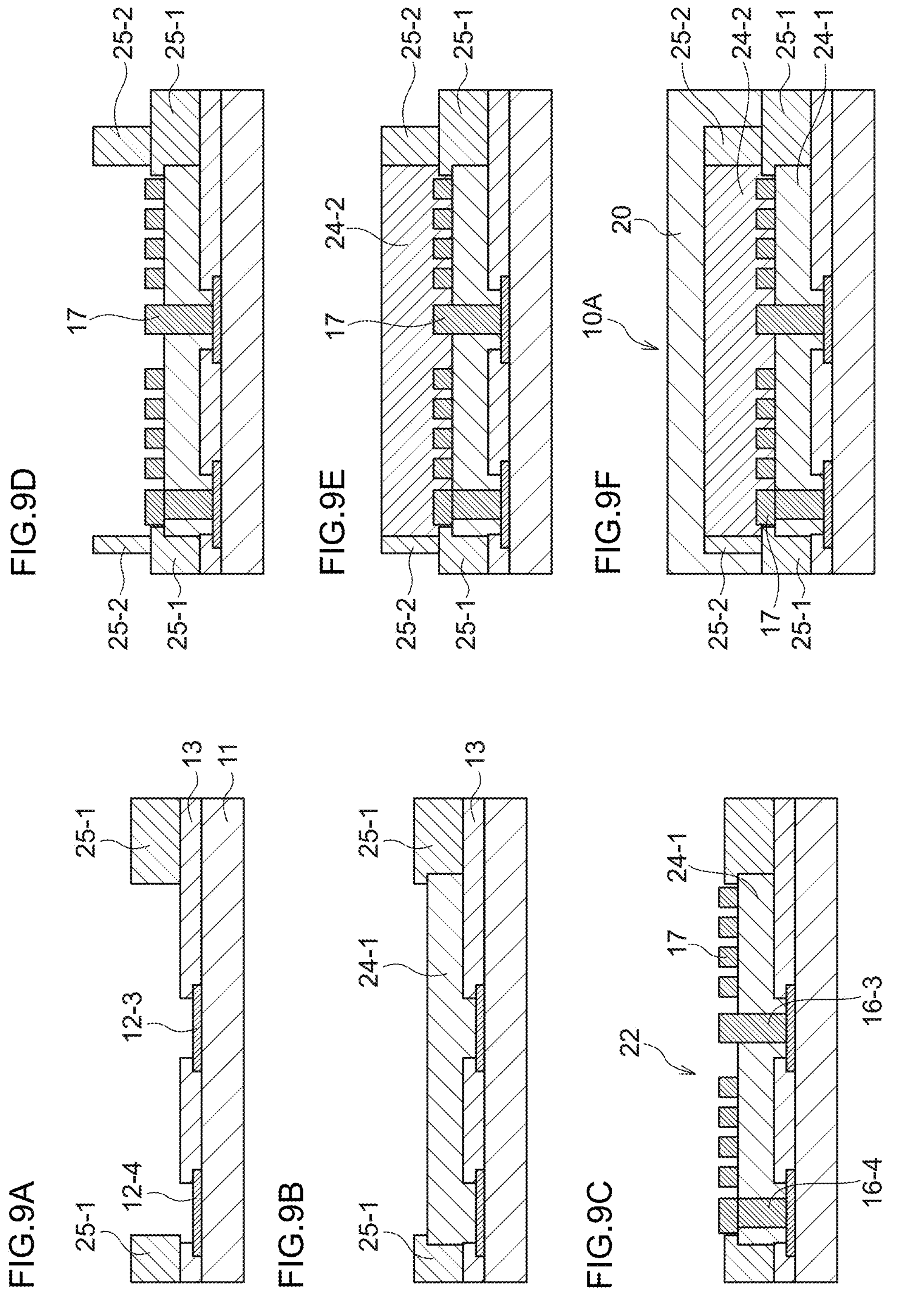
FIG. 9A to FIG. 9F are sectional diagrams depicting a fabrication method of the semiconductor device according to the second exemplary embodiment.

Next, the first soft magnetic material film 24-1 is applied inside the first support insulating film 25-1 surrounding the formation region of the inductor region 10A and is cured (FIG. 9B).

Figure 10A:
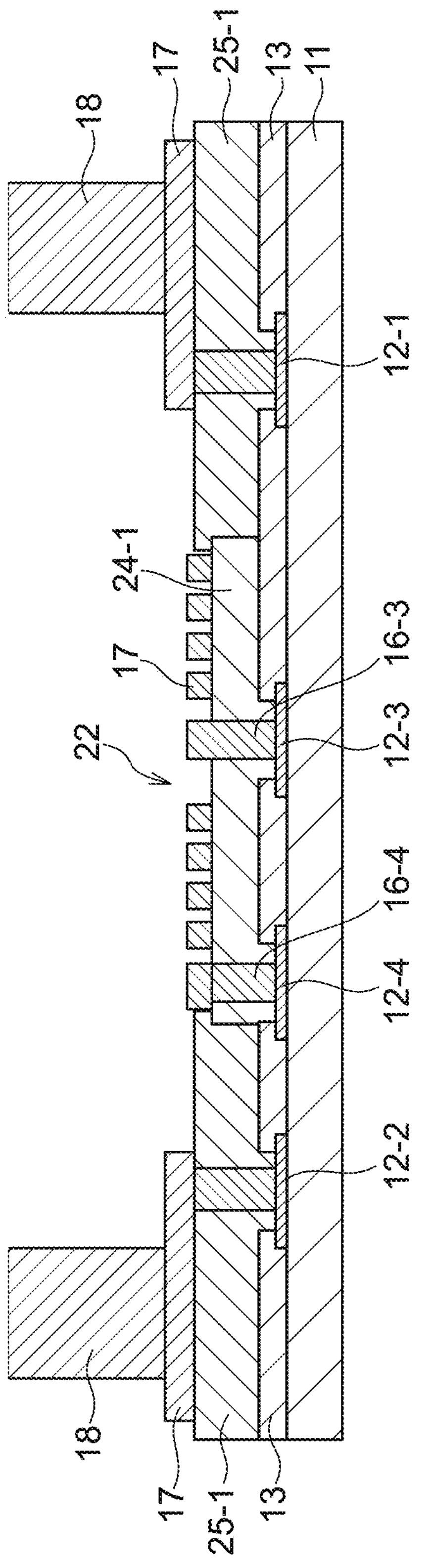
FIG. 10A and FIG. 10B are sectional diagrams depicting the fabrication method of the semiconductor device according to the second exemplary embodiment.

Then, holes are provided at positions of the first support insulating film 25-1 at which the vias 16-3 and 16-4 are to be formed, and are subsequently plated with a metal material (for example, Cu). The redistribution wiring 17 (which is to say the coil 22) is formed (FIG. 9C) using photolithography and etching. An intermediate state of the semiconductor device 50A at the present step is shown in FIG. 10A. As shown in FIG. 10A, the first support insulating film 25-1 extends to regions (including the circuit region 27 and the like) outside the region corresponding to the inductor region 10A, and the post 18 is formed after the formation of the redistribution wiring 17.

Using photolithography and etching, the second support insulating film 25-2 encircling the formation region of the inductor region 10A is formed at upper portions of the first support insulating film 25-1 (FIG. 9D).

The second soft magnetic material film 24-2 is applied inside the second support insulating film 25-2 and is cured (FIG. 9E).

Figure 10B:
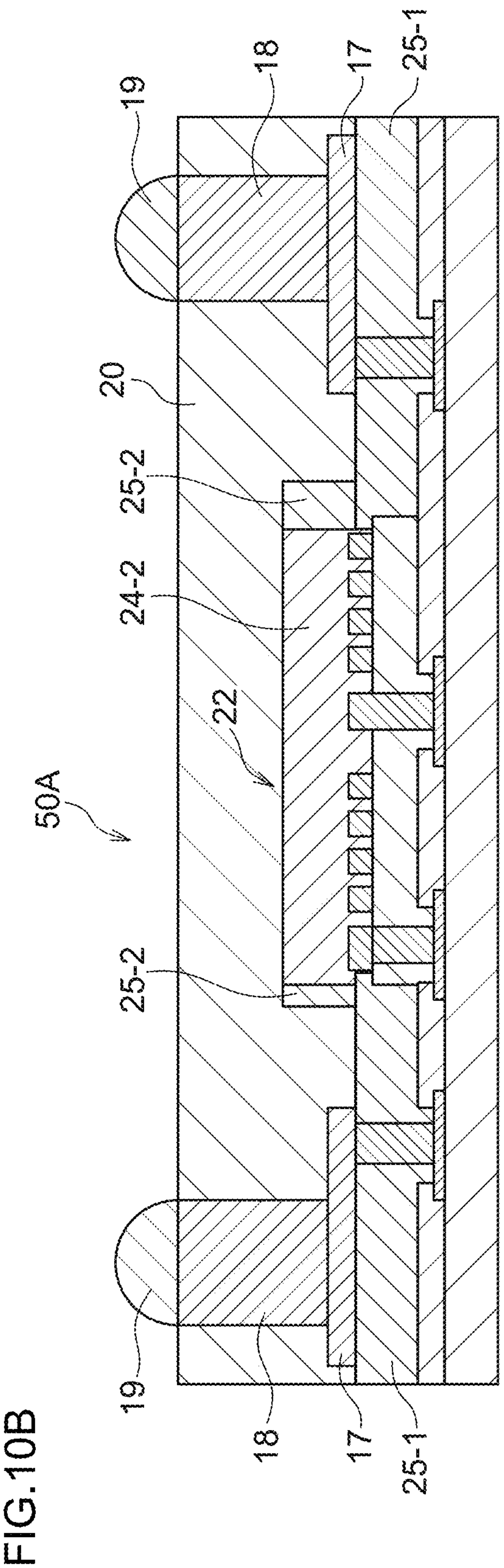

The mold 20 is applied to upper portions of the first support insulating film 25-1, the second support insulating film 25-2 and the second soft magnetic material film 24-2, and is cured (FIG. 9F). Subsequently, the wafer is diced into the respective semiconductor integrated circuits, and the semiconductor device 50A including the inductor region 10A is fabricated. An intermediate state of the semiconductor device 50A at the present step is shown in FIG. 10B. As shown in FIG. 10B, the mold 20 extends into regions (including the circuit region 27 and the like) outside the region corresponding to the inductor region 10A, and the mold 20 buries the surroundings of the post 18. The solder terminal 19 is formed at an upper portion of the post 18.

The semiconductor device 50 according to the exemplary embodiment described above is fabricated on the basis of the fabrication steps described above. The semiconductor device 50 is not provided with the second support insulating film 25-2; the insulating films 14 and 15 (see FIG. 1A) are formed in regions outside the region in which the inductor region 10 is to be formed. The inductor region 10 is formed in a region in which the insulating films 14 and 15 are not formed. To be more specific, the semiconductor device 50 is fabricated by, for example, the redistribution wiring process described below.

- The insulating films 14 and 15 are formed as films on the whole surface. The vias 16 are also formed at this time.
- An aperture is formed in the insulating films 14 and 15 at the region in which the inductor region 10 is to be formed. Alternatively, a mask may be used such that the insulating films 14 and 15 are not formed in the region in which the inductor region 10 is to be formed.
- The first soft magnetic material film 24-1 is applied in this aperture and is cured.
- The redistribution wiring 17 including the coil 22 is formed at upper portions of the insulating film 15 and the first soft magnetic material film 24-1, and the post 18 is formed.
- Using photolithography and etching, the second soft magnetic material film 24-2 is applied to upper portions of the redistribution wiring 17 and is cured.

In the exemplary embodiments described above, modes are illustrated and described in which the coil 22 is provided at an upper portion of the insulating film 15. However, taking account of layout and the like, a mode is possible in which the coil 22 is provided at an upper portion of the insulating film 14, and taking account of inductance value and the like, a mode is possible in which the coil 22 is provided at upper portions of both of the insulating layers 14 and 15 and the two coils 22 are connected by a via.

In the exemplary embodiments described above, modes are illustrated and described in which vias are provided in the soft magnetic material film 24 disposed at the lower portion relative to the coil 22 and connect the coil 22 with the circuit region 27. However, when no via should be provided in the soft magnetic material films 24 or when the circuit region 27 that should be connected is disposed at a location away from the coil 22, a mode is possible in which an end portion of the coil 22 extends to an upper portion of the first support insulating film 25-1, and a via is provided in the first support insulating film 25-1 and connects with the circuit region 27.

In the exemplary embodiments described above, modes are illustrated and described in which the first soft magnetic material film 24-1 and the second soft magnetic material film 24-2 are formed of the same material. However, taking account of fabrication steps and the like, modes are possible in which the two films are formed of different materials.

What is claimed is:

1. A semiconductor device comprising:

a semiconductor substrate including a circuit region;

a first insulating film covering at least a portion of the circuit region of the semiconductor substrate, the first insulating film including a first aperture extending therethrough and aligned over a first predetermined surface region of the substrate;

redistribution wiring disposed on the first insulating film;

a coil formed by the redistribution wiring on the first insulating film, the coil being connected to the circuit region and located over the first predetermined surface region of the substrate;

a first soft magnetic material film disposed over the first predetermined surface region of the substrate at least partially in the first aperture of the first insulating film, the first soft magnetic film located between the substrate and the coil; and a second insulating film covering at least a portion of the first insulating film, the second insulating film including a second aperture at least partially overlapping the first aperture of the first insulating film in a plane view;

a second soft magnetic material film that is disposed directly on the first soft magnetic material film over the second aperture in the second insulating film, the second soft magnetic material film covering at least a portion of the coil, wherein a thickness of the first soft magnetic material film in a direction perpendicular to a principal surface of the substrate is the same as a combined thickness of the first and second insulating films in the direction perpendicular to the principal surface of the substrate.

2. The semiconductor device according to claim 1, wherein:

the first insulating film encircles the first soft magnetic material film and the second insulating film encircles the second soft magnetic material film.

3. The semiconductor device according to claim 1, wherein:

the first soft magnetic material film and second soft magnetic material film are integrated by contacting an upper surface of the first soft magnetic material film with a lower surface of the second soft magnetic material film, and the coil is buried inside the integrated first soft magnetic material film and second soft magnetic material film.

4. The semiconductor device according to claim 1, wherein the coil is connected to the circuit region via a via provided in the first soft magnetic material film.

5. The semiconductor device according to claim 1, further comprising a terminal extending outside the semiconductor device, the terminal being provided on the first insulating film and being connected to the circuit region via a via provided in the first insulating film.

6. The semiconductor device according to claim 1, wherein an upper surface of the first soft magnetic material film is aligned with lower surfaces of the coil and the second soft magnetic material film.

7. The semiconductor device according to claim 6, wherein the coil is embedded within a lower region of the second soft magnetic material film along the upper surface of the first soft magnetic material film.

8. A semiconductor device comprising:

a semiconductor substrate including a circuit region;

a first insulating film covering at least a portion of the circuit region of the semiconductor substrate, the first insulating film including a first aperture extending therethrough and aligned over a first predetermined surface region of the substrate;

redistribution wiring disposed on the first insulating film;

a coil formed by the redistribution wiring on the first insulating film, the coil being connected to the circuit region and located over the first predetermined surface region of the substrate;

a first soft magnetic material film disposed over the first predetermined surface region of the substrate at least partially in the first aperture of the first insulating film, the first soft magnetic film located between the substrate and the coil; and a second insulating film covering at least a portion of the first insulating film, the second insulating film including a second aperture at least partially overlapping the first aperture of the first insulating film in a plane view;

a second soft magnetic material film that is disposed directly on the first soft magnetic material film over the second aperture in the second insulating film, the second soft magnetic material film covering at least a portion of the coil, wherein the first soft magnetic material film completely fills the first and second apertures of the respective first and second insulating films.

9. A method for fabricating a semiconductor device, the method comprising:

forming a circuit region on a semiconductor substrate;

forming a first insulating film in a region that includes an upper portion of the circuit region and excludes a first predetermined region;

forming a first soft magnetic material film inside the first predetermined region;

forming a coil at an upper portion of the first soft magnetic material film, the coil being connected to the circuit region;

forming a second insulating film in a region of an upper portion of the first insulating film, the region excluding a second predetermined region that overlaps with at least a portion of the first predetermined region in a plan view; and forming a second soft magnetic material film inside the second predetermined region.

* * * * *